United States Patent [19]

Houghton

[11] 4,413,191

[45] Nov. 1, 1983

[54] ARRAY WORD LINE DRIVER SYSTEM

[75] Inventor: Russell J. Houghton, Essex Junction, Vt.

[73] Assignee: International Business Machines Corporation, Armonk, N.Y.

[21] Appl. No.: 260,576

[22] Filed: May 5, 1981

[51] Int. Cl.³ .............. H03K 17/04; H03K 17/16; H03K 17/62
[52] U.S. Cl. ............................ 307/254; 307/246; 307/270; 307/300
[58] Field of Search ............ 307/254, 255, 270, 463, 307/246, 280, 300; 365/204, 203, 230

[56] References Cited

U.S. PATENT DOCUMENTS

| | | | |
|---|---|---|---|
| 3,354,321 | 11/1967 | Meyer | 307/246 |
| 3,474,419 | 10/1969 | Markowitz et al. | 365/230 |
| 3,688,280 | 8/1972 | Ayling et al. | 365/230 X |
| 3,740,730 | 6/1973 | Ho et al. | 365/230 |
| 3,863,229 | 1/1975 | Gersbach | 340/173 |
| 4,168,490 | 9/1979 | Stinehelfer | 307/246 X |

Primary Examiner—Larry N. Anagnos
Assistant Examiner—David R. Hudspeth
Attorney, Agent, or Firm—Stephen J. Limanek

[57] ABSTRACT

This invention provides a system for selectively driving one word line of a plurality of word lines in a memory array which includes a first highly capacitive common line connected to a plurality of driver circuits, each of which has connected to its output a respective word line and each of which includes a transistor having a capacitive junction connected to the common line. Means are provided for charging the common line and for rapidly discharging the common line through a selected driver circuit to its associated word line. Additionally, a second highly capacitive common line is connected to a point of reference potential through a resistor, with each of the driver circuits being connected between said first and second common lines.

16 Claims, 2 Drawing Figures

ARRAY WORD LINE DRIVER SYSTEM

DESCRIPTION

1. Technical Field

This invention relates to semiconductor integrated circuits and more particularly to a system for selectively accessing or driving word lines of a memory array.

2. Background Art

Cells of a memory array are generally arranged in rows and columns with, e.g., each row of cells being coupled to a separate word line and each column of cells being connected to a single bit/sense line or to a pair of bit/sense lines. Furthermore, the voltage on or current in each word line is controlled by a separate word driver circuit, as described and illustrated in, e.g., commonly assigned U.S. Pat. No. 3,863,229, filed on June 25, 1973, by J. E. Gersbach. Although not illustrated in the above referenced Gersbach patent, each driver circuit has its own load resistor connected to a voltage supply terminal. It is known that conventional decoding circuits are used to select only one of the plurality of word lines at a time. It is also known that prior to final selection of one of the word lines, the decoder tends to pull down on several driver circuits instead of just on the one driver circuit coupled to the desired word line. Such action not only produces delays in the final selection of a word line but it also can actually cause a false selection or the selection of an undesired word line in the array.

DISCLOSURE OF THE INVENTION

It is an object of this invention to provide an improved system for driving word lines of a memory array.

It is another object of this invention to provide an improved system for driving word lines of a memory array which operates faster than known systems or driving circuits in high performance memory systems.

It is yet another object of this invention to provide an improved word line driving system which is less likely to make an erroneous selection of a word line of an array.

It is still another object of this invention to provide an improved word line driving system which more rapidly and more accurately selects a desired word line of a plurality of word lines in a memory array.

In accordance with the teachings of this invention, an improved array word line driver system employing an overshoot current in a selected word line driver circuit provides improved performance without using complex circuitry. The improved system includes a highly capacitive common line connected to a plurality of word line driver circuits, each of which is connected to a respective word line. Means are provided for charging the common line and for rapidly discharging this line through a selected driver circuit to an associated word line. In a preferred embodiment of the invention, the common line is made highly capacitive by providing each driver circuit with a device having a capacitive junction coupled to the common line. More specifically, each of the driver circuits may include a current amplifier having a transistor with an emitter-base junction capacitance connected to the common line. The charging means may include a common resistor connected between a first terminal of a voltage supply source and the highly capacitive common line.

Additionally, a second common resistor is connected at one end to a second terminal, e.g., ground, of the voltage supply source and at its other end to each word line driver circuit via a second highly capacitive common line.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
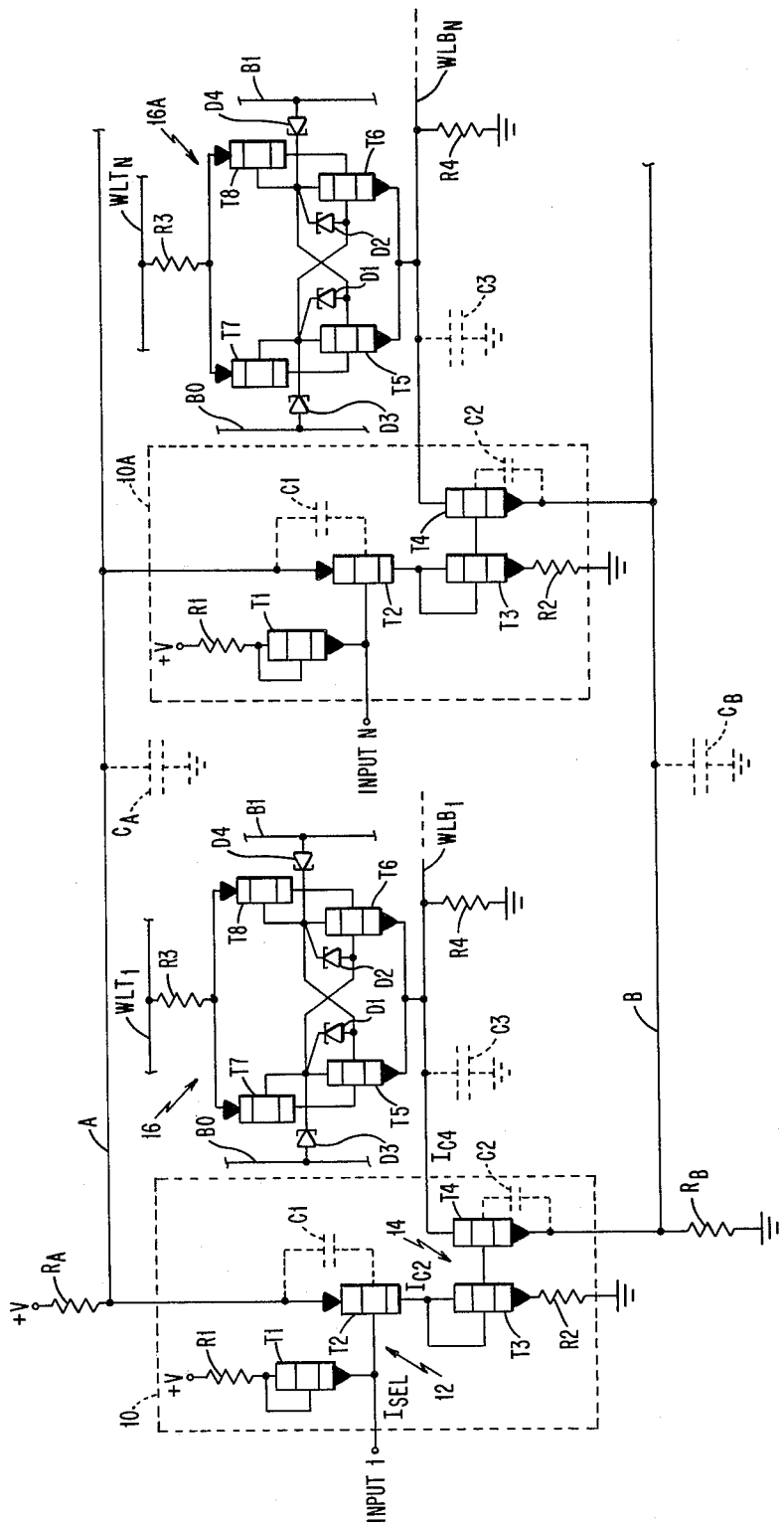
FIG. 1 is a circuit diagram of the array word line driver system of the present invention.

Referring to FIG. 1 of the drawing in more detail, there is illustrated an embodiment of a word line driver system for a memory array in accordance with the teachings of the present invention. This system is provided with a first driver circuit 10 which includes a first current amplifier 12 having an NPN transistor T1 and a serially arranged first resistor R1 connected between a first terminal +V of a voltage supply source and an input terminal INPUT 1, with the emitter of the transistor T1 being connected to the input terminal INPUT 1 and with the base and collector of the transistor T1 being interconnected. A PNP transistor T2 having a base-emitter junction capacitance, indicated by capacitor C1, has its base connected to the emitter of transistor T1. The first driver circuit 10 also is provided with a second current amplifier 14 having NPN transistors T3 and T4 interconnected at their bases. The collector and base of the transistor T3 are interconnected and are further connected to the collector of the PNP transistor T2 of the first current amplifier 12. The emitter of the NPN transistor T3 is connected to a point of ground potential through a second resistor R2 and the capacitance of the base-emitter junction of transistor T4 is indicated by capacitor C2.

The first driver circuit 10 is connected at the emitter of the PNP transistor T2 of the first amplifier 12 to a first terminal +V of a voltage source through a first common resistor $R_A$ and at the emitter of the NPN transistor T4 of the second amplifier 14 to a second terminal, indicated as ground, of the voltage supply source through a second common resistor $R_B$. The collector of the NPN transistor T4 is connected to a bottom word line $WLB_1$ to which a plurality of memory cells, e.g., 64 cells, of an array are connected, only one cell 16 of which is illustrated in FIG. 1 of the drawings. The cell 16, which is the well known silicon controlled rectified cell described in the above referenced U.S. Patent, includes effectively a pair of cross-coupled NPN transistors T5 and T6 and a pair of PNP load transistors T7 and T8 connected to the cross-coupled transistors T5 and T6. The emitters of the cross-coupled transistors T5 and T6 are interconnected and further connected to the bottom word line $WLB_1$, and the emitter of the load transistors T7 and T8 are interconnected and further connected to a top word line $WLT_1$ through a cell resistor R3. The bottom word line $WLB_1$ is connected to ground through a word line resistor R4 and a capacitor C3 representing the equivalent load capacitance of all cells connected to the word line WLB$_1$, and the top word line WLT$_1$ is connected to a voltage source through one or more other resistors, not shown, in a conventional manner. First and second Schottky clamping diodes D1 and D2 are connected between the base and collector of the cross-coupled transistors T5 and T6, respectively. A pair of bit/sense lines B0 and B1 are connected to the cell 16 through third and fourth gating means shown as Schottky diodes D3 and D4, respectively.

A second word line driver circuit 10A, illustrated in FIG. 1 of the drawings and similar to the first word line driver circuit 10, is also connected at the emitter of the PNP transistor T2 of its first amplifier 12 to the first terminal +V of the voltage source through the first common resistor R$_A$ and at the emitter of the NPN transistor T4 of its second amplifier 14 to the second terminal, or ground, of the voltage source through second common resistor R$_B$. The second driver circuit 10A is also connected to an input terminal INPUT N at the base of its PNP transistor T2 and to another bottom word line WLB$_N$ at the collector of its NPN transistor T4. A plurality of memory cells are also connected between the bottom word line WLB$_N$ and a top word line WLT$_N$, with only cell 16A being illustrated. Another pair of bit/sense lines B0 and B1 are also connected to cell 16A.

It should be noted that the PNP transistor T2 of the second word line driver circuit 10A also has a capacitive emitter-base junction, illustrated by capacitor C1, which is connected to the capacitive emitter-base junction of the PNP transistor T2 in the first word line driver circuit 10 via a first common conductive line A. Since the first and second word line driver circuits 10 and 10A are only two of many more, e.g., 100, such circuits, it can be seen that the conductive line A becomes a very highly capacitive line, with the capacitance of line A being indicated by capacitor C$_A$ in FIG. 1. In a like manner, a second common conductive line B connected to the emitter of the NPN transistors T4 of each of the word line driver circuits, such as circuits 10 and 10A, is a highly capacitive line since each of the parallelly arranged base-emitter junctions of the NPN transistors T4 are capacitive. The capacitance of line B is indicated at C$_B$ in FIG. 1.

Figure 2:
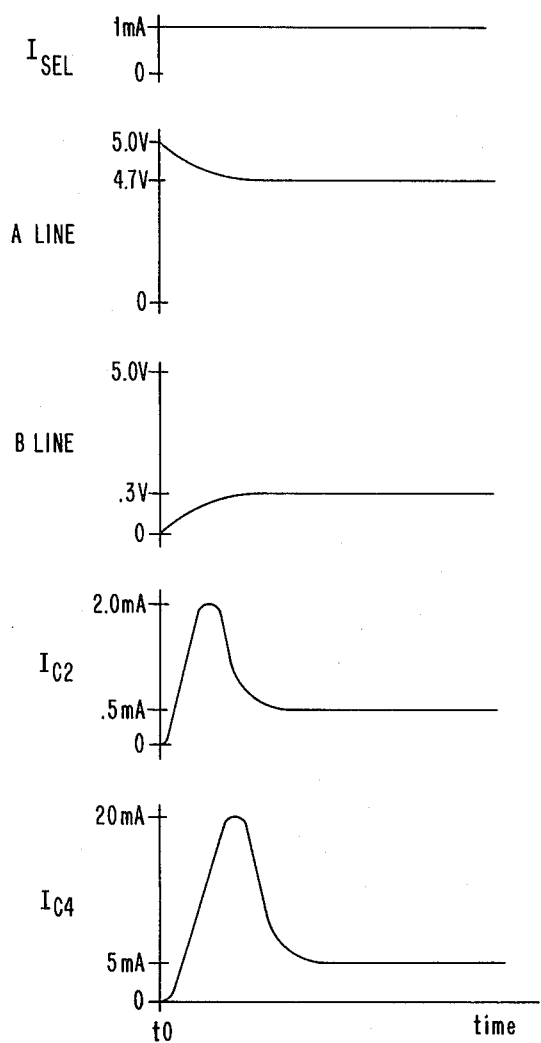
FIG. 2 is a series of curves indicating the current and voltage relationships against time produced within the system illustrated in FIG. 1 of the drawings.

To better understand the operation of the system of the present invention illustrated in FIG. 1 of the drawings, reference may be had to the series of curves in FIG. 2 indicating the current and voltage relationships against time produced within the system of FIG. 1. Prior to the time t$_o$ when the system is on standby, the current I$_{SEL}$ at the input terminals INPUT 1 and N is zero and, therefore, no current flows through the PNP transistor T2, nor through the NPN transistor T4 of the driver circuits 10 and 10A. Accordingly, the capacitive line A, i.e., capacitor C$_A$, is charged to the voltage +V through the first common resistor R$_A$ and the capacitive line B, i.e., capacitor C$_B$, is discharged to substantially zero volts through the second common resistor R$_B$. The word lines WLB$_1$ and WLB$_N$ are charged to a predetermined standby voltage through the memory cells attached to these word lines.

At a time t$_o$ when, e.g., driver circuit 10 is selected, the current I$_{SEL}$ increases to about 1 milliampere with substantially all of this current passing through PNP transistor T2 of circuit 10, since the emitter of transistor T2 is at +V volts in view of the charged large capacitor C$_A$, whereas the voltage at the collector of the NPN transistor T1 is at +V volts minus the voltage drop in the first resistor R1. Before any significant current can pass through the transistor T1 the large capacitor C$_A$ must be discharged by the emitter current in PNP transistor T2. This I$_{SEL}$ current causes a high or overshoot current I$_{C2}$ to flow in the collector of PNP transistor T2, as indicated in FIG. 2 of the drawings. This high current I$_{C2}$ turns on NPN transistors T3 and T4 of the second current amplifier 14 causing an even higher overshoot I$_{C4}$, as indicated in FIG. 2 of the drawings, to be produced in the collector of the NPN transistor T4, discharging the selected bottom word line WLB$_1$. The overshoot in the collector current I$_{C4}$ is particularly strong since the second current amplifier 14 is driven by the overshoot I$_{C2}$ and the second current amplifier 14 in cooperation with the second large capacitor C$_B$ is designed to produce its own overshoot in the same manner as the overshoot was produced by the first current amplifier 12 in cooperation with the first large capacitor C$_A$. Accordingly, with this arrangement an overshoot multiplying effect is produced in the driver circuit 10. This overshoot characteristic of the word line drive current at the collector of the NPN transistor T4 provides additional drive for faster discharging and selection of the word line WLB$_1$.

After the overshoot current disappears a voltage is developed across the first resistor R1 which is approximately equal to the voltage developed across the first common resistor R$_A$, when the capacitor C$_A$ is substantially discharged, assuming transistors T1 and T2 have the same V$_{BE}$. The collector current I$_{C2}$ at the PNP transistor T2 is equal to I$_{SEL}$ × R1/R$_A$ which drives the second current amplifier 14 in the same manner as I$_{SEL}$ drives the first current amplifier 12. The output current at the collector of the NPN transistor T4 which drives the bottom word line WLB$_1$ is then approximately equal to I$_{SEL}$ × R1/R$_A$ × R2/R$_B$, with amplification occurring between the input and output based on the resistor ratios.

The first common capacitor C$_A$ has been shown for convenience in understanding as being connected between the first common line A and a point of ground potential, however, in practice a point of reference potential other than ground may be used, such as the input terminals connected to the base of the PNP transistors T2. It should also be understood that, if desired, either or both common lines A and B may have a discrete capacitor connected thereto.

It can be seen that as soon as the word line capacitor C3 is discharged to a predetermined select level, which may occur at a time even before the current I$_{C4}$ reaches its peak, the write or read portion of an accessing cycle may begin.

An additional benefit of the common lines A and B is recovery from false selects. As is known, decoders tend initially to pull down several inputs by, e.g., current splitting, before the desired word line is selected. Any one or more driver circuits falsely selected is recovered by the decrease in voltage on first common line A when it is being discharged turning off the PNP transistors T2 and by the increase in voltage on the second common line B when it is being charged turning off the NPN transistors T4 in the unselected driver circuits.

Although a system of the present invention has been illustrated in FIG. 1 as having a driver circuit with a PNP transistor T2 connected to the first common line A, it should be understood that, if desired, the driver circuits may include an NPN transistor having a capacitive junction connected to the first common line A. Likewise, a PNP transistor having a capacitive junction coupled to the second common line B may be used in the driver circuits in accordance with the teachings of the present invention. It should also be understood that memory cells other than the type illustrated in FIG. 1 of the drawings may be used in a memory array coupled to the word lines, such as word lines $WLB_1$ and $WLB_N$.

It can be seen that by simply appropriately interconnecting the plurality of driver circuits used to drive a like plurality of word lines, an array word line driver system is provided which has a substantially improved power performance and which protects against false selects. This system uses a single resistor $R_A$ to connect all driver circuits to the terminal +V of the voltage source and a single resistor $R_B$ to connect all driver circuits to ground to achieve such results.

While the invention has been particularly shown and described with reference to preferred embodiments thereof, it will be understood by those skilled in the art that various changes in form and details may be made therein without departing from the spirit and scope of the invention.

What is claimed is:

1. A driver system comprising:
   a first common conductive line,
   a plurality of load lines,
   a plurality of switching means, each of said means having a given capacitive element coupled to said common line and each of said means being connected between said common line and a respective one of said plurality of load lines,
   means for precharging said common line and said plurality of load lines during a first period of time, and
   means for selectively actuating one of said plurality of switching means during a second period of time for discharging said precharged common line to thereby effect the discharge of the respective load line of said actuated switching means.

2. A driver system comprising:
   a first common conductive line,
   a capacitor connected to said common line,
   a plurality of load lines,
   a plurality of switching means, each of said means being connected between said common line and a respective one of said plurality of load lines,
   means for precharging said common line and said plurality of load lines during a first period of time, and
   means for selectively actuating one of said plurality of switching means during a second period of time for discharging said precharged common line to thereby effect the discharge of the respective load line of said actuated switching means.

3. A memory array driver system comprising:
   a first common conductive line,
   a second common conductive line having a capacitive impedance connected thereto,
   a plurality of word lines,
   a plurality of switching means, each of said means having a given capacitive element coupled to said first common line and each of said means being connected between said first and second common lines, and to a respective one of said plurality of word lines,
   means for charging said first common line and said plurality of word lines, and
   means for selectively actuating one of said plurality of switching means for discharging said first common line to thereby effect the discharge of the respective word line of said actuated switching means.

4. A driver system as set forth in claim 1 wherein each of said switching means includes a transistor having a junction capacitance coupled to said common line.

5. A driver system as set forth in claim 4 wherein said transistor is a PNP transistor having its emitter-base junction capacitance coupled to said common line.

6. A memory array driver system as set forth in claim 3 wherein each of said switching means includes a first transistor having a capacitive junction coupled to said first common line and wherein said charging means includes a resistor and a source of potential coupled to said first common line through said resistor.

7. A memory array driver system as set forth in claim 6 wherein each of said switching means includes a first current amplifier including said first transistor and a second current amplifier coupled to said first current amplifier including a second transistor.

8. A driver system comprising:
   a first common conductive line,
   a plurality of load lines,
   a plurality of switching means, each of said means having a given capacitive element coupled to said common line and each of said means being connected between said common line and a respective one of said plurality of load lines,
   means for charging said common line and said plurality of load lines,
   a resistor,
   a second common conductive line connected to a point of reference potential through said resistor,
   each of said switching means further including a second capacitive element coupled to said second common line, and
   means for selectively actuating one of said plurality of switching means for discharging said first common line to thereby effect the discharge of the respective load line of said actuated switching means.

9. A driver system comprising:
   a first common conductive line,
   a capacitor connected to said common line,
   a plurality of load lines,
   a plurality of switching means, each of said means being connected between said common line and a respective one of said plurality of load lines,
   means for charging said common line and said plurality of load lines,
   a resistor,
   a second common conductive line connected to a point of reference potential through said resistor,
   each of said switching means being connected between said first and second common lines, and
   means for selectively actuating one of said plurality of switching means for discharging said first common line to thereby effect the discharge of the respective load line of said actuated switching means.

10. A memory array driver system comprising:
    a first common conductive line,
    a plurality of word lines,
    a plurality of amplifying means, each of said means having a first current amplifier including a first transistor having a capacitive junction forming a given capacitive element coupled to said common line and a second current amplifier coupled to said first current amplifier including a second transistor, and each of said means being connected between said common line and a respective one of said plurality of word lines, means for charging said common line and said plurality of load lines, a resistor, a second common conductive line connected to a point of reference potential through said resistor, said second transistor including a capacitive junction connected to said second common line, and means for selectively actuating one of said plurality of amplifying means for discharging said first common line to thereby effect the discharge of the respective word line of said actuated amplifying means.

11. A driver system as set forth in claim 8 wherein each of said switching means includes a first transistor including said given capacitive element and a second transistor including said second capacitive element.

12. A driver system as set forth in claim 11 wherein each of said switching means includes a first current amplifier including said first transistor and a second current amplifier including said second transistor.

13. A driver system as set forth in claim 12 wherein said first transistor is a PNP transistor and said second transistor is an NPN transistor and the output of said first amplifier being coupled to the input of said second amplifier.

14. A driver system as set forth in claim 13 wherein said selectively actuating means includes means for supplying a current to said first current amplifier.

15. A driver system as set forth in claim 9 wherein said switching means is a current amplifier and said charging means includes a second resistor and a source of potential coupled to said first common line through said second resistor.

16. A memory array driver system as set forth in claim 10 wherein said first transistor is a PNP transistor and said second transistor is an NPN transistor, and said selectively actuating means includes means for supplying current to said first transistor.

* * * * *